(12) United States Patent
Korony

(10) Patent No.: US 10,879,865 B2
(45) Date of Patent: Dec. 29, 2020

(54) WIRE-BOND TRANSMISSION LINE RC CIRCUIT

(71) Applicant: AVX Corporation, Fountain Inn, SC (US)

(72) Inventor: Gheorghe Korony, Myrtle Beach, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/041,225

(22) Filed: Jul. 20, 2018

(65) Prior Publication Data

US 2018/0351527 A1    Dec. 6, 2018

Related U.S. Application Data

(63) Continuation of application No. 15/093,875, filed on Apr. 8, 2016, now Pat. No. 10,033,346.

(60) Provisional application No. 62/149,992, filed on Apr. 20, 2015.

(51) Int. Cl.
| | | |
|---|---|---|
| *H03H 1/02* | (2006.01) | |
| *H05K 1/18* | (2006.01) | |
| *H01G 4/10* | (2006.01) | |

(52) U.S. Cl.
CPC ............... *H03H 1/02* (2013.01); *H01G 4/10* (2013.01); *H05K 1/18* (2013.01)

(58) Field of Classification Search
CPC ............. H01G 4/10; H05K 1/18; H03H 1/02
USPC ........ 333/172; 361/321, 401, 328, 329, 330, 361/395
See application file for complete search history.

(56) References Cited

U.S. PATENT DOCUMENTS

| | | | |
|---|---|---|---|
| 5,585,776 A | * | 12/1996 | Anderson ............... H01C 1/034 204/192.21 |
| 5,889,445 A | | 3/1999 | Ritter et al. |
| 5,963,110 A | | 10/1999 | Ihara et al. |
| 6,285,542 B1 | | 9/2001 | Kennedy, III et al. |
| 6,373,348 B1 | | 4/2002 | Hagerup |
| 6,525,628 B1 | | 2/2003 | Ritter et al. |

(Continued)

FOREIGN PATENT DOCUMENTS

| | | |
|---|---|---|
| JP | S 57-121166 | 7/1982 |
| JP | H 03276617 A | 12/1991 |

(Continued)

OTHER PUBLICATIONS

James J. Licari et. al.,"Hybrid Microcircuit Technology Handbook: Materials, Processes, Design", 2nd edition, Noyes Publications,1998, (Year: 1998).*

(Continued)

*Primary Examiner* — Benny T Lee
*Assistant Examiner* — Hafizur Rahman
(74) *Attorney, Agent, or Firm* — Dority & Manning, P.A.

(57) ABSTRACT

Disclosed are apparatus and associated methodology providing for fixed components that exhibit tailorable variations in frequency response depending on the applied frequencies over the component's useful frequency range. The presently disclosed subject matter provides improved operational characteristics of generally known transmission line capacitor devices by providing a parallel resistive component constructed as a portion of the dielectric separating electrodes corresponding to a capacitor.

26 Claims, 6 Drawing Sheets

(56) References Cited

U.S. PATENT DOCUMENTS

| | | |
|---|---|---|
| 6,819,569 B1 | 11/2004 | Broman et al. |
| 6,876,270 B2 | 4/2005 | Ono et al. |
| 6,898,070 B2 | 5/2005 | Korony et al. |
| 7,005,722 B2 | 2/2006 | Schaper et al. |
| 7,034,631 B2 | 4/2006 | Ono et al. |
| 7,200,010 B2 | 4/2007 | Broman et al. |
| 9,111,682 B2 | 8/2015 | Sawada et al. |
| 9,450,556 B2 | 9/2016 | Korony et al. |
| 9,722,568 B2 | 8/2017 | Korony et al. |
| 9,755,609 B2 | 9/2017 | Korony et al. |
| 2006/0232356 A1 | 10/2006 | Roldan et al. |
| 2010/0117768 A1 | 5/2010 | Chuang et al. |
| 2011/0069463 A1 | 3/2011 | Chen |
| 2015/0116055 A1 | 4/2015 | Park et al. |
| 2015/0171920 A1 | 6/2015 | Kameya |

FOREIGN PATENT DOCUMENTS

| | | |
|---|---|---|
| JP | H 07176403 A | 7/1995 |
| JP | 2001338838 | 12/2001 |
| JP | 2003142590 A | 5/2003 |
| JP | 2004303745 A | 10/2004 |
| JP | 2004349352 A | 12/2004 |
| JP | 2006114698 A | 4/2006 |
| JP | 2006319409 A | 11/2006 |

OTHER PUBLICATIONS

Dielectric Laboratories application note entitles, "Gain Slope issues in Microwave modules", published in Jan. 2014 (Year: 2014).*

Mi et al.,"Integrated Passives for High-Frequency Applications", InTech Open, 2010 (Year: 2010).*

The Accu-P® Thin-Film Technology data sheet of AVX, p. 6-7, downloaded from AVX website on Jul. 2, 2019 (Year: 2019).*

Ulrich et al.,"Comparison of Paraelectric and Ferroelectric Materials for Applications as Dielectrics in Thin Film Integrated Capacitors", The International Journal of Microcircuits and Electronic Packaging, vol. 23, No. 2, Second Quarter 2000, pp. 172-180 (Year: 2000).*

AmTech wire bonding process description, Wire Bonding—AmTECH Microelectronics, © 2019 (Year: 2019).*

Alafogianni et al., "Resistor trimming geometry; past, present and future", presented at the 39th International Microelectronics and Packaging IMAPS Poland 2015 Conference. (Year: 2015).*

Machine Translation of JP2006319409A, Nov. 24, 2006 (Year: 2006) (Year: 2006).*

J. Andresakis et al., 1645861 Novel Substrate With Combined Embedded Capacitance and Resistance for Better Electrical Performance and Higher Integration (published. Abstract), In Proceeding of Electronic Components and Technology Conference, 2006.

Licari et al.,"Hybrid Microcircuit Technology Handbook: Materials, Processes, Design". $2^{nd}$ Edition, Noyes Publications, 1998, pp. 82-84.

William F. Lieske, Sr., "The Fifty for Ohm Enigma or, Have you got a match?". EMR Corporation, Apr. 1, 2011, pp. 1-14.

Sun et al., RC Passive Equalizer for Through Silicon Via (published Abstract), Electrical Performance of Electronic Packaging and Systems, (EPEPS), 2010 IEEE 19th Conference, Oct. 2010.

* cited by examiner

WIRE-BOND TRANSMISSION LINE RC CIRCUIT

CROSS REFERENCE TO RELATED APPLICATIONS

The present application is a continuation of U.S. application Ser. No. 15/093,875, filed on Apr. 8, 2016 and now issued as U.S. Pat. No. 10,033,346, which claims the benefit of U.S. Provisional Patent Application entitled "WIRE-BOND TRANSMISSION LINE RC CIRCUIT," assigned U.S. Ser. No. 62/149,992, filed Apr. 20, 2015, both of which are incorporated herein by reference for all purposes.

FIELD OF THE SUBJECT MATTER

The presently disclosed subject matter relates to wire-bond transmission line resistor-capacitor (RC) circuits. In particular, the presently disclosed subject matter relates to improvements in such wire-bond devices that provide for fixed components that exhibit tailored variations in frequency response depending on the applied frequencies over the component's useful frequency range.

BACKGROUND OF THE SUBJECT MATTER

Transmission line capacitor circuits may be used in various forms including for DC blocking when placed in series with a transmission line, for RF and source bypassing when in shunt with a transmission line or RF source, and for impedance matching among other applications. Such devices operate by passively adjusting the impedance characteristic of the signal pathway and have applicability in a broad range of applications including optical transceiver modules, broadband receivers, Transmit Optical Sub-Assemblies (TOSA), Receive Optical Sub-Assemblies (ROSA), and various other high frequency devices.

Known wire-bond transmission line capacitive devices have been developed that respond to many of such uses but have not provided a device that meets current desirable operational requirements such as the ability to tailor responses over the usable frequency range of the device. It would be advantageous, therefore, if a device could be developed that could be tailored to provide differing responses from the device over the device's useful frequency range.

SUMMARY OF THE SUBJECT MATTER

In view of the recognized features encountered in the prior art and addressed by the presently disclosed subject matter, improved apparatuses and methodologies have been developed that provide for tailoring differing responses over the useful operating frequency of the device.

In accordance with one aspect of an exemplary embodiment of the presently disclosed subject matter, a parallel connected RC circuit has been provided wherein the primary response of the device operating at relatively lower frequencies is tailored to that of the RC time-constant, while at higher frequencies the device response is based more on the capacitive component. In some embodiments of the presently disclosed subject matter, a layer of resistive material is placed between some or all of the area between electrodes corresponding to a capacitor structure to form a parallel resistor-capacitor (RC) structure.

In accordance with another aspect of presently disclosed subject matter, a parallel RC circuit may be configured in some instances based on the structure of a transmission line. In exemplary selected embodiments, such transmission line may include a backside ground.

In accordance with additional aspects of exemplary embodiments of the presently disclosed subject matter, the transmission line RC circuit may be provided with wire-bond pad structures. In yet further embodiments, the transmission line structure may be provided on various substrates, each providing additional advantageous characteristics to the completed structure. In particularly advantageous embodiments, the layer of resistive material may be laser trimmed to provide exact desired resistive values.

One presently disclosed exemplary embodiment relates to an RC circuit component for insertion in a transmission line, such circuit component comprising a monolithic substrate, a capacitor, and a thin-film resistor. Preferably, such monolithic substrate has a top surface; such capacitor is supported on such substrate top surface and has first and second electrodes separated at least in part by a dielectric layer; and such thin-film resistor is received at least in part between such capacitor first and second electrodes, and connected in parallel with such capacitor. The frequency response of such RC circuit component exemplary embodiment depends on the applied frequencies over the component's useful frequency range.

In some variations of such exemplary embodiment, such monolithic substrate may have opposing first and second longitudinal ends; and such component may further comprise a pair of wire bond pads supported on such substrate top surface respectively at such first and second longitudinal ends thereof, and with such wire bond pads coupled respectively with such first and second electrodes of such capacitor.

In other alternatives, such thin-film resistor may comprise a layer of resistive material trimmed to provide an exact desired resistive value for tailoring the frequency response of such component. Per further variations thereof, such layer of resistive material may comprise at least one of tantalum nitride (TaN), nickel-chromium alloys (NiCr), and ruthenium oxide (RuO2), and have sheet resistance up to about 100Ω.

For other variations, such substrate may comprise at least one of fused silica, quartz, alumina, and glass.

In yet other alternative exemplary embodiments, such monolithic substrate may have a bottom surface; and such component further may comprise a ground electrode received on such substrate bottom surface. In others, such first and second electrodes may at least partially overlap; and such resistor may be received in such overlap. For other alternatives, such dielectric layer may comprise at least one of silicon oxynitride (SiON) and barium titanate (BaTiO3). For yet others, the values of such capacitor and resistor may be chosen such that the impedance at each of such pair of wire bond pads is about 50Ω.

In another presently disclosed exemplary embodiment, a wire-bond transmission line RC circuit may preferably comprise a monolithic substrate having a top surface, a bottom surface, and opposing first and second longitudinal ends; a capacitor supported on such substrate top surface and having a first electrode, and a second electrode at least partially overlapping such first electrode so as to define an electrode overlap area therebetween, such capacitor further comprising a dielectric layer received in at least part of such electrode overlap area; a pair of wire bond pads, supported on such substrate top surface respectively at such first and second longitudinal ends thereof, and coupled respectively with such first and second electrodes of such capacitor; and a thin-film resistor. Per such embodiment, preferably such thin-film resistor is received at least in part in such electrode overlap area, and connected in parallel with such capacitor, and with such thin-film resistor comprising a layer of resistive material formed to provide a determined resistive value for selectively tailoring the frequency response of such RC circuit over the circuit's useful frequency range.

Per variations of such exemplary embodiment, such wire-bond transmission line RC circuit may further comprise a ground electrode received on such substrate bottom surface. In further such variations, such layer of resistive material may comprise at least one of tantalum nitride (TaN), nickel-chromium alloys (NiCr), and ruthenium oxide (RuO2), and have sheet resistance up to 100Ω. Further, such substrate may comprise at least one of fused silica, quartz, alumina, and glass, while such dielectric layer may comprise at least one of silicon oxynitride (SiON) and barium titanate (BaTiO3).

In other alternatives, the capacitance value of such capacitor and the resistive value of such resistor may be chosen such that the impedance at each of such pair of wire bond pads is about 50Ω.

It is to be understood from the complete disclosure herewith that the presently disclosed subject matter equally encompasses corresponding and/or associated methodology. For example, one presently disclosed exemplary embodiment of such encompassed methods relates to methodology for tailoring the frequency response of an RC circuit component for insertion in a transmission line, such circuit component comprising the type having a monolithic substrate having a top surface, a capacitor supported on such substrate top surface and having at least partially overlapping first and second electrodes separated at least in part by a dielectric layer, with a signal pathway through such circuit component, such methodology comprising including a thin-film resistor received at least in part between the capacitor first and second electrodes, and connected in parallel with such capacitor; and forming the resistive value of such resistor so as to passively adjust the impedance characteristic of the circuit signal pathway for selectively tailoring the frequency response of such RC circuit component over the circuit component's useful frequency range.

Per some variations of the foregoing exemplary embodiment, such methodology may further comprise selecting the capacitance value of such capacitor and the resistive value of such resistor so that the primary response of the RC circuit component operating at relatively lower frequencies is tailored to that of the RC time-constant, while at higher frequencies the RC circuit component response is based more on the capacitive component, so that the fixed RC circuit component has tailored variations in frequency response depending on the applied frequencies over the circuit component's useful frequency range.

In other presently disclosed variations, such monolithic substrate may have opposing first and second longitudinal ends; and such methodology may further comprise providing a pair of wire bond pads supported on such substrate top surface respectively at said first and second longitudinal ends thereof, and with said wire bond pads coupled respectively with the first and second electrodes of such capacitor.

In other presently disclosed alternatives, such step of forming the resistive value may comprise providing a layer of resistive material trimmed to provide an exact desired resistive value for tailoring the frequency response of such RC circuit component. Per further such variations, such layer of resistive material may comprise at least one of tantalum nitride (TaN), nickel-chromium alloys (NiCr), and ruthenium oxide (RuO2), and has sheet resistance up to about 100Ω.

In other presently disclosed variations, such substrate may comprise at least one of fused silica, quartz, alumina, and glass; and such monolithic substrate may have a bottom surface, so that such methodology also may further comprise providing a ground electrode received on such substrate bottom surface.

Pet yet other alternatives, such dielectric layer may comprise at least one of silicon oxynitride (SiON) and barium titanate (BaTiO3). Also, the capacitance value of such capacitor and the resistive value of such resistor may be chosen such that the impedance at each of said pair of wire bond pads is about 50Ω.

Still further, per presently disclosed alternative methodologies, such monolithic substrate may have a bottom surface; and such step of forming the resistive value may comprise providing a layer of resistive material trimmed to provide an exact desired resistive value for tailoring the frequency response of such RC circuit component; and such methodology may further comprise providing a ground electrode received on such substrate bottom surface.

Additional embodiments of the presently disclosed subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which.

Figure 1:
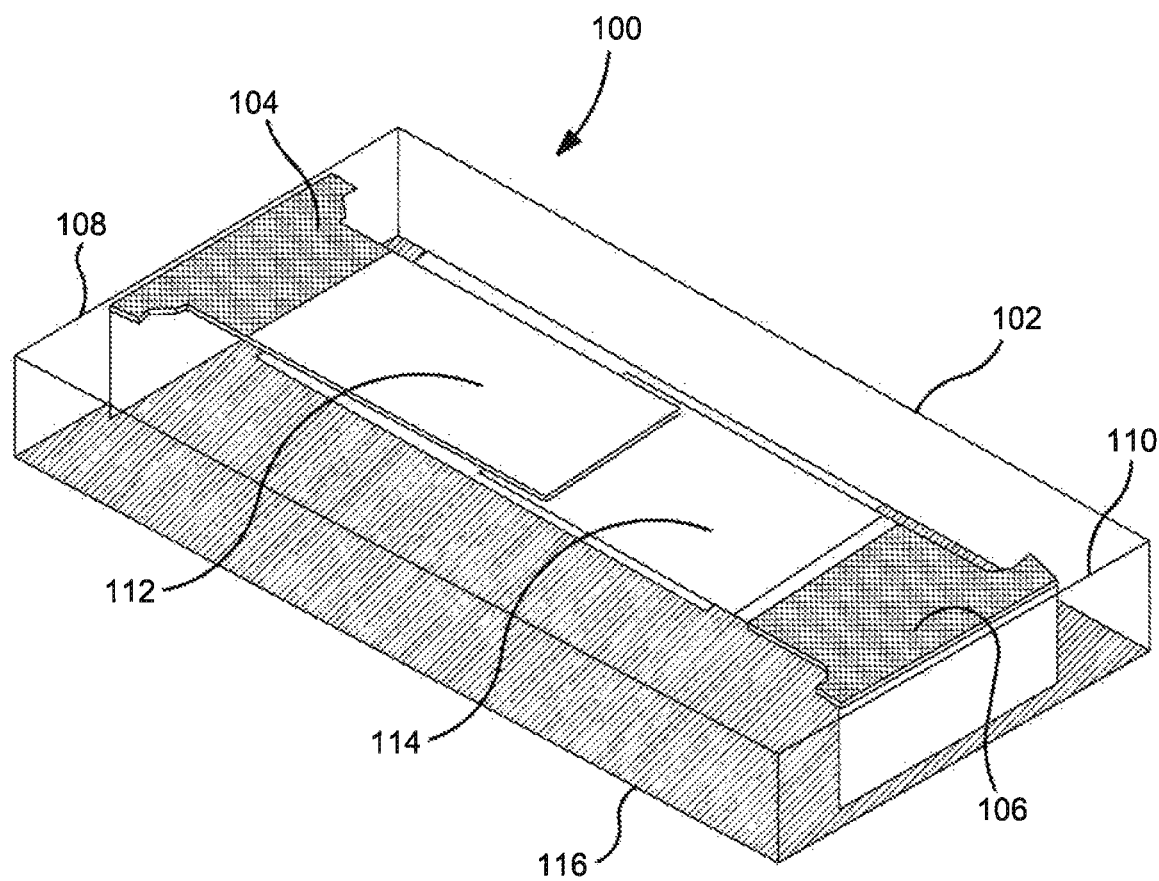
FIG. 1 illustrates the internal configuration of a previously known transmission line and series capacitor construction.

Repeat use of reference characters throughout the present specification and appended drawings is intended to represent same or analogous features or elements.

DETAILED DESCRIPTION OF THE SUBJECT MATTER

As discussed in the Summary of the Subject Matter section, the presently disclosed subject matter is particularly concerned with improvements to wire-bond parallel connected RC devices that provide for tailored fixed components that exhibit variations in frequency response depending on the applied frequencies over the component's useful frequency range.

Selected combinations of aspects of the disclosed technology correspond to a plurality of different embodiments of the presently disclosed subject matter. It should be noted that each of the exemplary embodiments presented and discussed herein should not insinuate limitations of the presently disclosed subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference is made hereafter in detail to the presently preferred embodiments of the subject parallel wire-bond transmission line RC circuit. Referring to the drawings, FIG. 1 illustrates a previously known transmission line capacitor 100 constructed on substrate 102. Capacitor 100 is provided with wire-bond pads 104, 106 positioned at opposite ends 108, 110, respectively of substrate 102. A relatively small value capacitor is formed by the overlapping arrangement of electrodes 112, 114, which electrodes are coupled to wire-bond pads 104, 106, respectively. In such known construction, the capacitor may have a value of 2 pF and the substrate may be constructed from fused silica. Known similar devices provide for constructing substrates of quartz, alumina, glass and other substances. For example, FIGS. 7 and 8 also illustrate characteristics of a known device similar to that illustrated in FIG. 1 but constructed on an alumina substrate.

Figure 2:
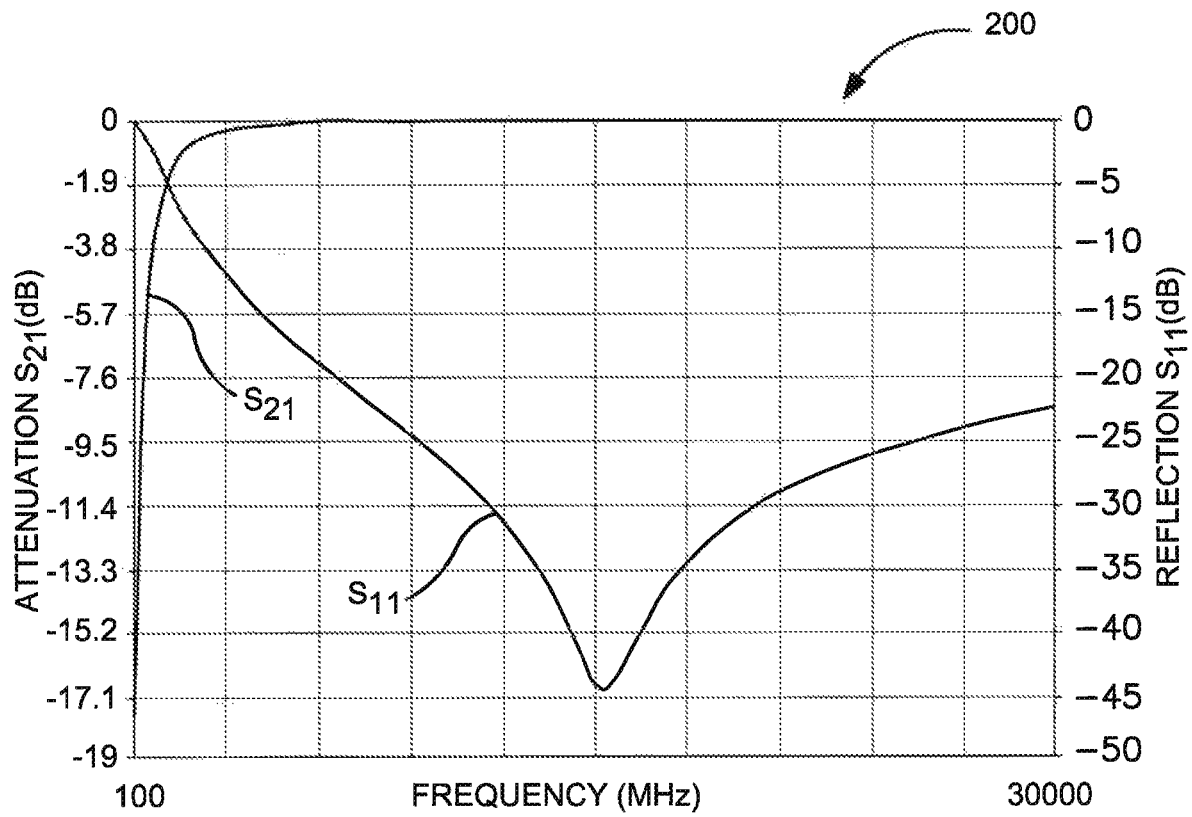
FIG. 2 illustrates graphic response curves related to the previously known device illustrated in FIG. 1.
Figure 3:
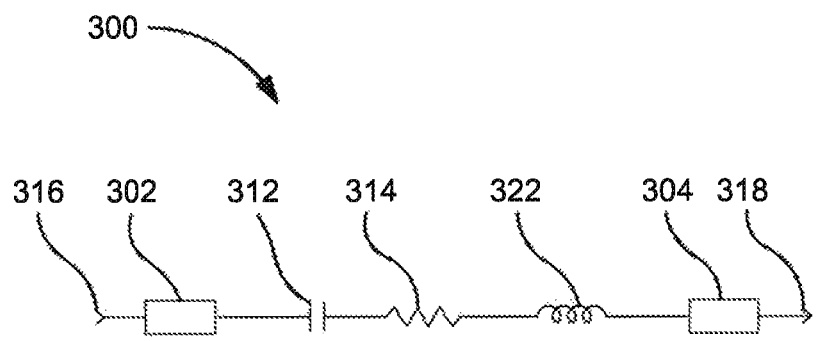
FIG. 3 illustrates an equivalent circuit diagram for the previously known device illustrated in FIG. 1.

FIGS. 2 and 3 illustrate characteristics of the known device of FIG. 1 with FIG. 2 illustrating response curves for the device while FIG. 3 illustrates an equivalent circuit 300 for the device of FIG. 1.

In accordance with such known device, capacitor 100 may correspond to a silicon oxynitride (SiON) capacitor having a first electrode 112 thereof coupled to wire bond pad 104 on fused silica substrate 102. Capacitor 100 also includes a second electrode 114 at least partially below first electrode 112 and separated therefrom via a SiON layer (not seen in this view). Electrode 114 is coupled to wire bond pad 106. A backside electrode 116 functions as a ground plane for the assembled device.

With reference to FIG. 2, there are illustrated graphic response curves 200 related to the device illustrated in FIG. 1. Those of ordinary skill in the art will appreciate that the notations $S_{11}$ and $S_{21}$ represent reflection and forward transmission coefficients, respectively, for the transmission line circuit 100. As illustrated in FIG. 2, the forward transmission coefficients $S_{21}$ and reflected coefficients $S_{11}$ for a high frequency structural simulator (HFSS) simulated model of device 100 and for that of the equivalent circuit illustrated in FIG. 3, track exactly and are thus illustrated together with common respective $S_{11}$ and $S_{21}$ notations. As illustrated in FIG. 2, the frequency scale of such example corresponds to 100-30,000 MHz so that the resonance point as illustrated by the dip in the $S_{11}$ line is about 15,425 MHz. Of special interest is the fact that the forward transmission coefficient $S_{21}$ line is virtually flat over the entire useful operating range after rising rapidly from the lower frequency operating range according with the value of the capacitor.

With reference to FIG. 3, there is illustrated an equivalent circuit diagram for the exemplary device illustrated in FIG. 1. As noted above and illustrated in FIG. 2, the response curves for the equivalent circuit track exactly the HFSS simulation of the circuit. In such example, transmission line 302 had a width of 0.24 mm and a length of 0.584 mm while transmission line 304 had a width of 0.2 mm and a length of 0.4 mm. Capacitor 312 had a value of 1.931 pF, an equivalent series resistance 314 of 0.013Ω, and an equivalent series inductance 322 of 0.011 nH. The transmission line structure produced a characteristic impedance ($Z_0$) of 50Ω at both the input port 316 and output port 318.

Figure 4:
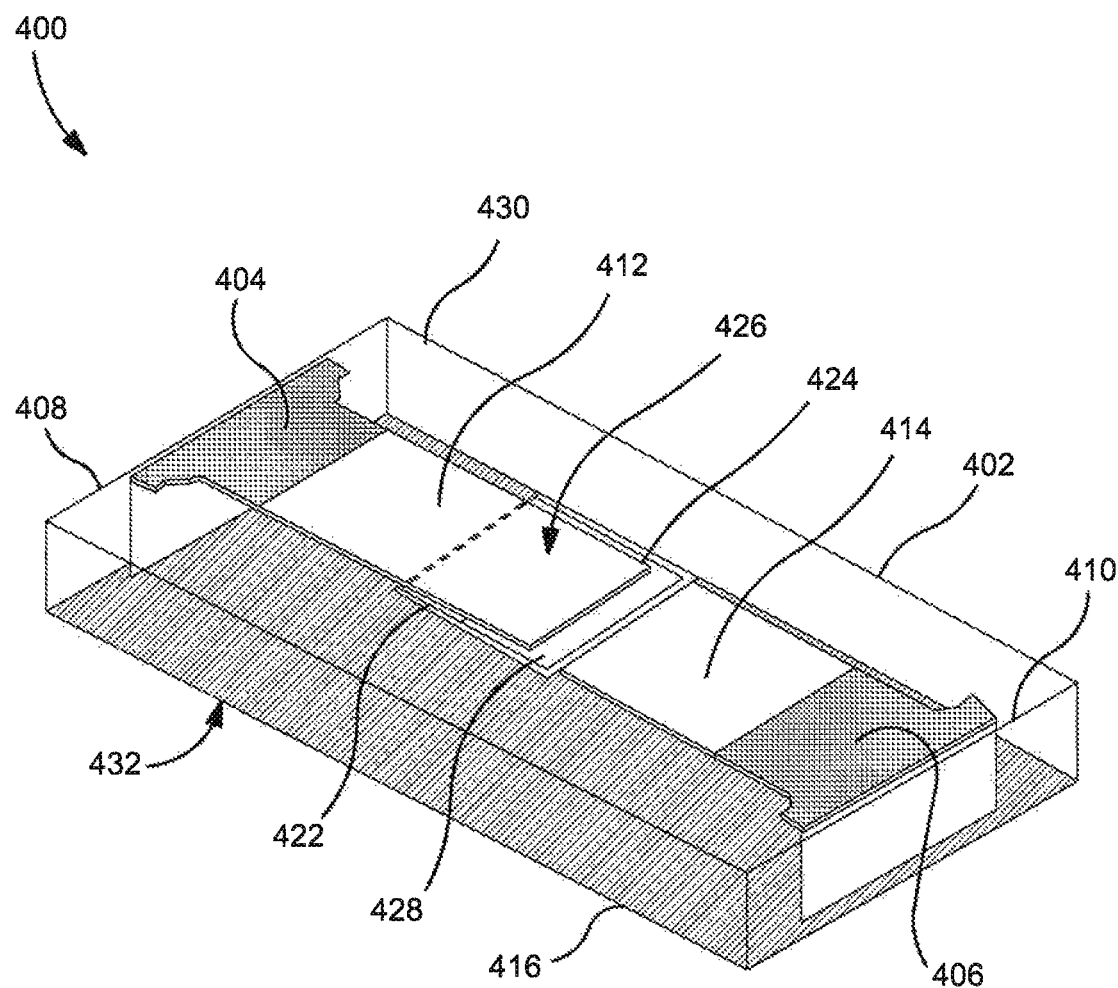
FIG. 4 illustrates exemplary internal configuration of a transmission line including a resistor and parallel connected capacitor in accordance with the presently disclosed subject matter.

With reference to FIG. 4, an exemplary embodiment of an internal configuration of a transmission line 400 including a thin-film resistor 422 and parallel connected capacitor 426 in accordance with the presently disclosed subject matter is illustrated. From a comparison with the device illustrated in FIG. 1 and that of FIG. 4 constructed in accordance with the presently disclosed subject matter, it will be noticed that the internal components have some similarities but with the exception of the inclusion of thin-film resistor 422. Thus, generally, transmission line 400 is constructed on a top surface 430 of substrate 402 and includes a first electrode 412 thereof coupled to wire bond pad 404 positioned on one longitudinal end 408 of substrate 402, and a second electrode 414 below first electrode 412 and at least partially overlapped by first electrode 412.

First electrode 412 is at least partially separated from second electrode 414 by SiON layer 428 and also at least partially separated from second electrode 414 by thin-film resistor 422. Electrode 414 is coupled to wire bond pad 406 at a second longitudinal end 410 of substrate 402. A backside electrode 416 is provided on a bottom surface 432 of substrate 402 and functions as a ground plane for the assembled device.

As with the device illustrated in FIG. 1, substrate 402 may also be constructed from fused silica. Thin-film resistor 422 may correspond to a tantalum nitride (TaN) layer having 25 to 100Ω sheet resistance. It should be appreciated, however, by those of ordinary skill in the art that other resistive materials may be used in addition to or in place of TaN. Other suitable materials include, but are not limited to, nickel-chromium alloys (NiCr) and ruthenium oxide ($RuO_2$). Such thin-film resistors may be trimmed using laser techniques well known in the art to provide precision resistor values for use with the presently disclosed subject matter. Likewise, it should be appreciated that materials other than SiON may be used for the dielectric material for capacitor 426 including, but not limited to, barium titanate.

Figure 5:
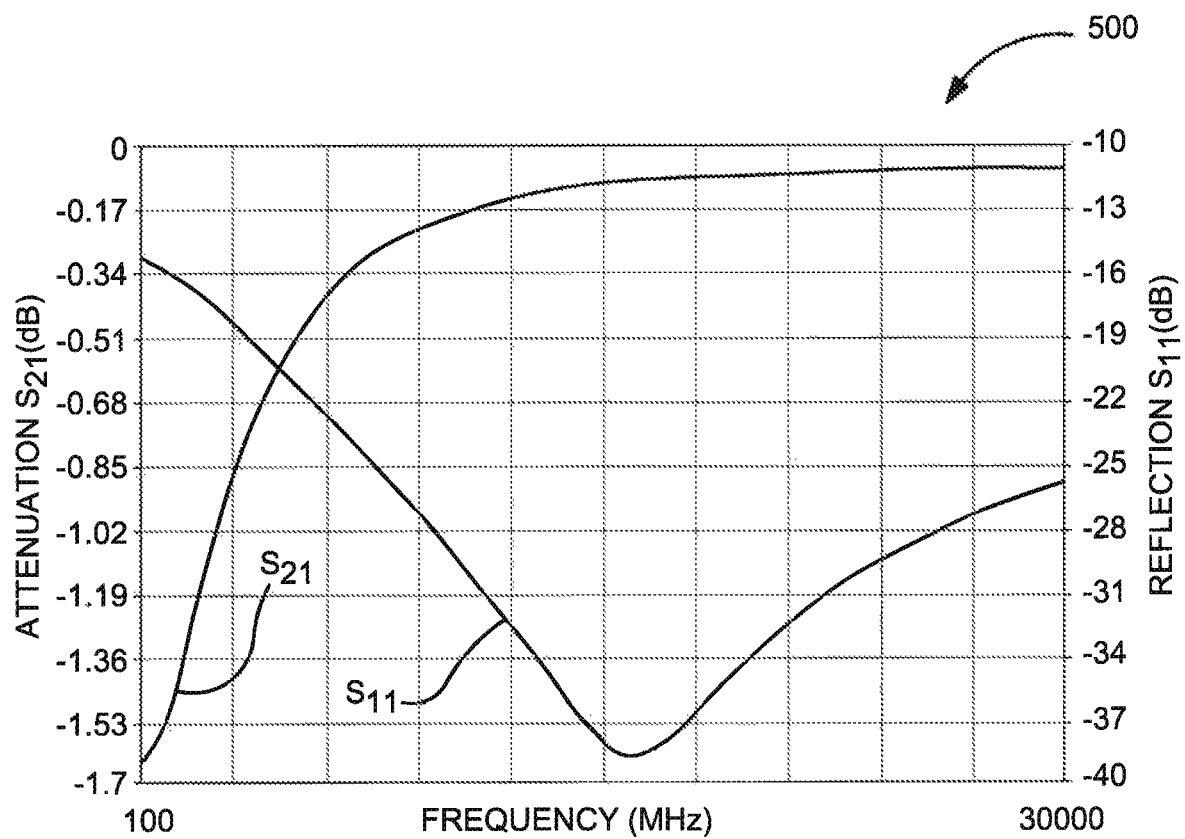
FIG. 5 illustrates graphic response curves related to the exemplary device illustrated in FIG. 4.

With reference to FIG. 5, there are illustrated graphic response curves 500 related to the exemplary device illustrated in FIG. 4. From an inspection of FIG. 5, it will be noticed that the forward transmission coefficient $S_{21}$ for both a HFSS simulated model and for that of the equivalent circuit illustrated in FIG. 6, track exactly and are thus illustrated as a single line $S_{21}$. Similarly, the reflection coefficients $S_{11}$ for a HFSS simulated model and that of the equivalent circuit also track exactly and are illustrated as single line $S_{11}$.

An inspection of FIG. 5 shows that the resonance frequency for the device illustrated in FIG. 4 is slightly higher on the frequency scale than that illustrated in the curves 200 of FIG. 2. As with the curves illustrated in FIG. 2, the frequency scale of such example corresponds to 100-30,000 MHZ so that the resonance point is about 16,200 MHz. Of interest here is the fact that the forward transmission coefficient $S_{21}$ is seen to gradually increase at the lower end of the operating range of the exemplary device, according to the RC (Resistor Capacitor) product, before flattening out in the mid to upper operating frequency ranges. Such response is due to the inclusion of thin-film resistor 422 which provides the desired tailorable variations in frequency response in dependence on the applied frequencies and particular construction of the capacitive and resistive components over the component's useful frequency range.

Figure 6:
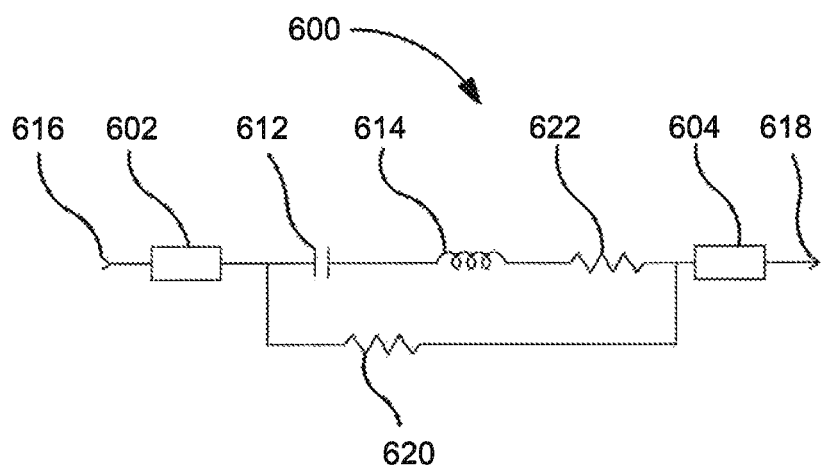
FIG. 6 illustrates an equivalent circuit diagram for the exemplary device illustrated in FIG. 4.

With reference to FIG. 6, there is illustrated an equivalent circuit diagram 600 for the device illustrated in FIG. 4. In such example, transmission line 602 had a width of 0.203 mm and a length of 0.239 mm while transmission line 604 had a width of 0.194 mm and a length of 0.269 mm. Capacitor 612 had a value of 2.502 pF, an equivalent series resistance 622 of 0.428Ω, and an equivalent series inductance 614 of 1.283e-3 nH. Parallel connected resistor 620 had a value of 20.617Ω. The transmission line structure produced a characteristic impedance ($Z_0$) of 50Ω at both the input port 616 and output port 618.

Figure 7:
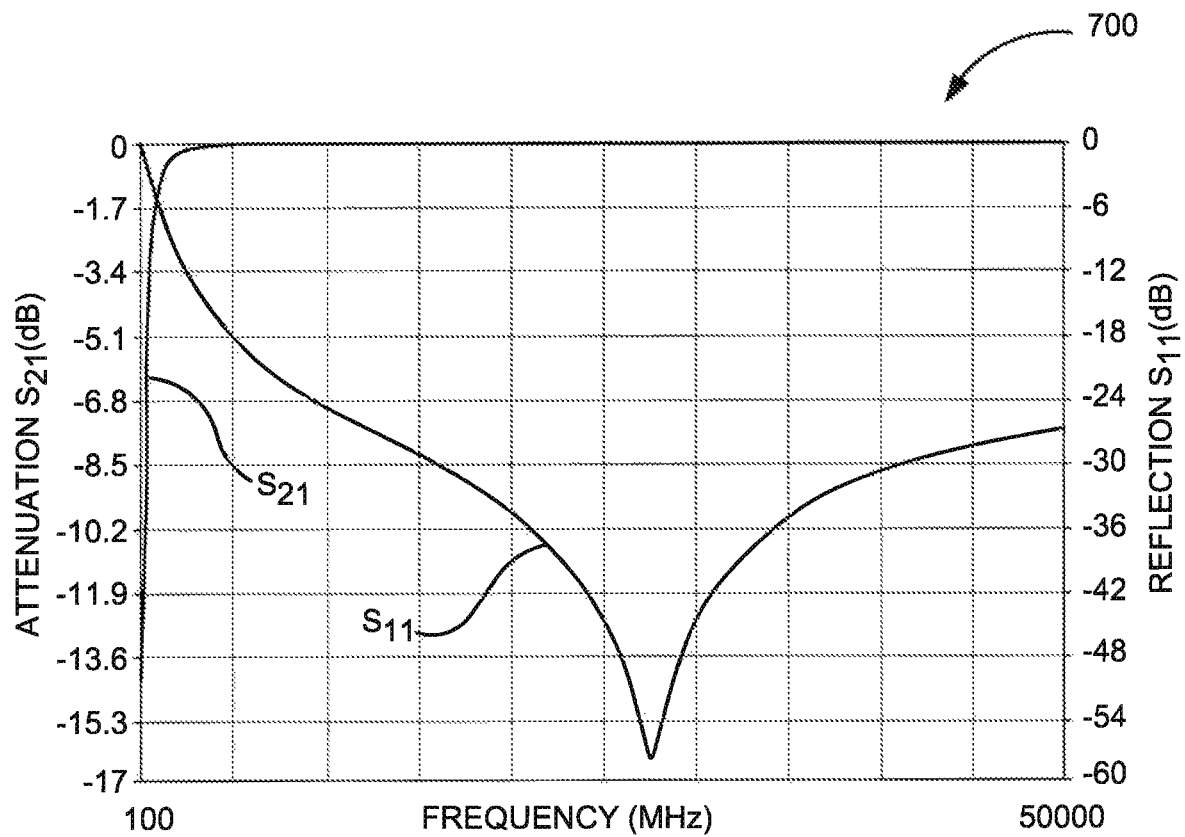
FIG. 7 illustrates graphic response curves related to an embodiment of the previously known device of FIG. 1 but constructed using an alternative substrate material.

FIG. 7 illustrates graphic response curves 700 related to an embodiment of the previously known device of FIG. 1 constructed using an alternative substrate material, for example, in such case, alumina. As may be seen by comparison with the graph of FIG. 2 wherein the substrate was made of fused silica, the reflection coefficient $S_{11}$ overall has a steeper slope and the resonance frequency is slightly higher. The forward transmission coefficient $S_{21}$ rises significantly faster at the lower frequencies than did that of the graph of FIG. 2 and thereafter remains substantially flat for the entire useful operating frequency range. Again in both a modeled and equivalent circuit, the $S_{11}$ and $S_{21}$ values track exactly and are thus illustrated in FIG. 7 as single lines. It should be noted that the frequency range associated with the graphs of FIG. 7 as well as that of FIG. 8 described herein, correspond to a range of 100 to 50000 MHz.

Figure 8:
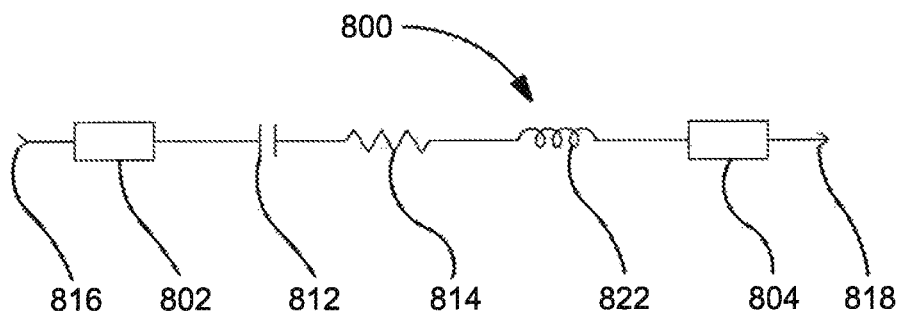
FIG. 8 illustrates an equivalent circuit diagram for the exemplary device illustrated in FIG. 1 using the alternative substrate material.

FIG. 8 illustrates an equivalent circuit diagram 800 for the device illustrated in FIG. 1 using an alumina substrate. As noted above and illustrated in FIG. 7, the response curves for the equivalent circuit track exactly a simulation of the circuit. In such example, transmission line 802 had values of Z=46.174Ω and L=6.03° while transmission line 804 had values of Z=40.51Ω and L=26.415°. Capacitor 812 had a value of 2.416 pF, an equivalent series resistance 814 of 0.401Ω and an equivalent series inductance 822 of 0.022 nH. The transmission line structure produced a characteristic impedance ($Z_0$) of 50Ω at both the input port 816 and output port 818.

Figure 9:
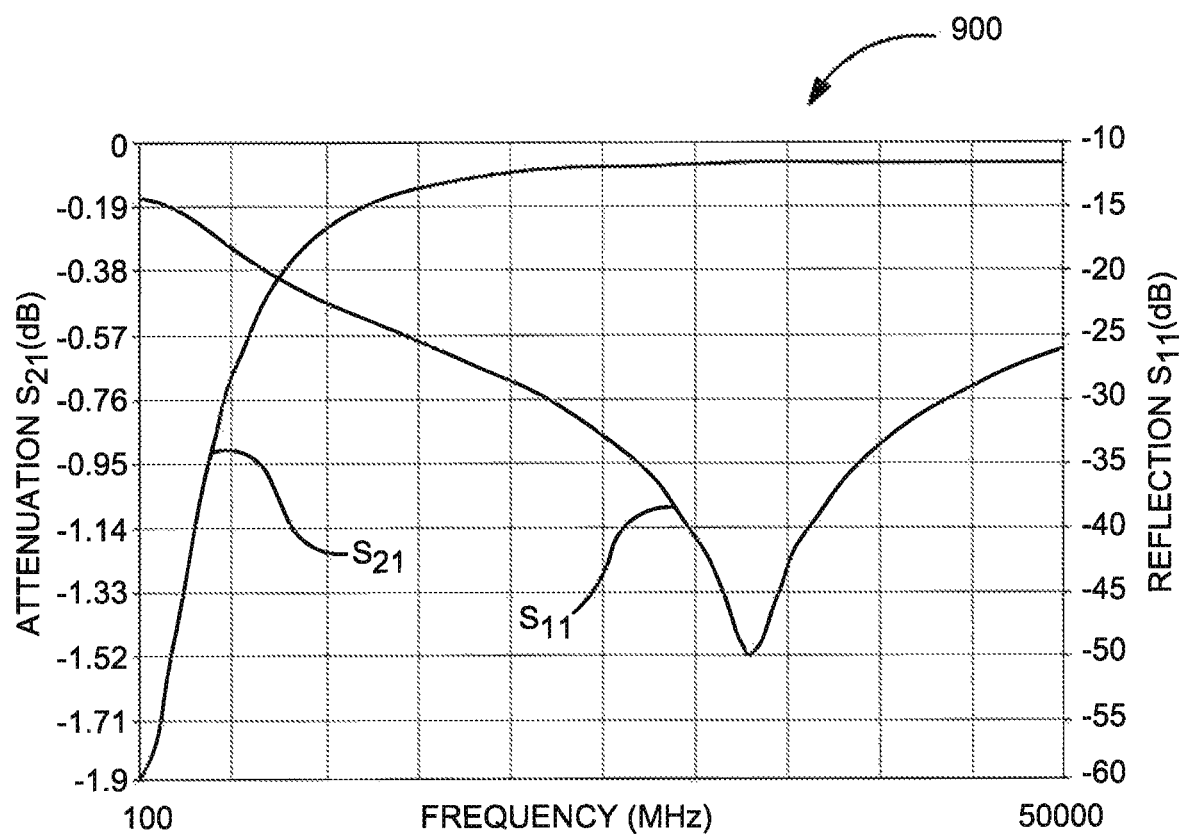
FIG. 9 illustrates graphic response curves related to the device illustrated in FIG. 4 using the alternative substrate material.

FIG. 9 illustrates graphic response curves 900 related to an embodiment of the presently disclosed subject matter illustrated in FIG. 4 constructed using an alumina substrate. As may be seen by comparison with the graph of FIG. 5 wherein the substrate was made of fused silica, the reflection coefficient $S_{11}$ overall has a steeper slope and the resonance frequency is slightly higher. The forward transmission coefficient $S_{21}$ rises slightly faster at the lower frequencies than did that of the graph of FIG. 5 and thereafter remains substantially flat for the entire useful operating frequency range. Again, in both the HFSS modeled and equivalent circuit, the $S_{11}$ and $S_{21}$ values track exactly and are thus illustrated in FIG. 7 as single lines.

Figure 10:
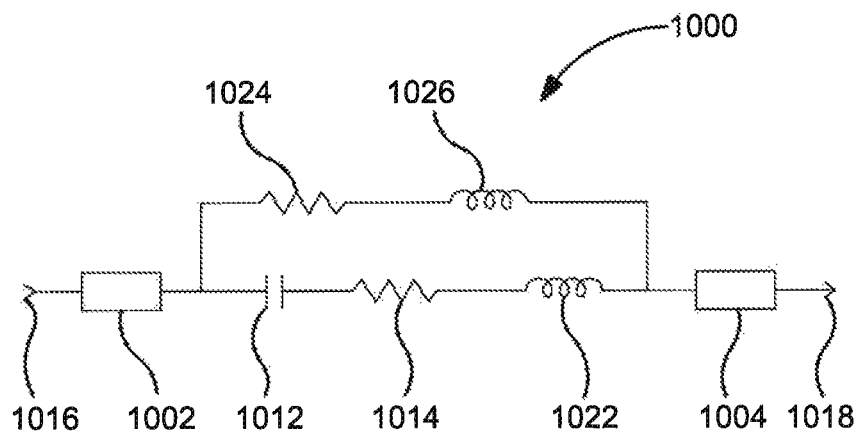
FIG. 10 illustrates an equivalent circuit diagram for the exemplary presently disclosed device illustrated in FIG. 4 constructed using the alternative substrate material.

FIG. 10 illustrates an equivalent circuit diagram 1000 for the exemplary device illustrated in FIG. 4 but using an alumina substrate. As noted above and illustrated in FIG. 9, the response curves for the equivalent circuit track exactly a simulation of the circuit. In such example, transmission line 1002 had values of Z=49.186Ω and L=20.924° while transmission line 1004 had values of Z=49.023Ω and L=25.192°. Capacitor 1012 had a value of 2.646 pF, an equivalent series resistance 1014 of 0.389Ω, and an equivalent series inductance 1022 of 0.021 nH. Parallel resistor 1024 had a value of 2Ω and had an equivalent series inductance 1026 of 0.01 nH. The transmission line structure produced a characteristic impedance ($Z_0$) of 50Ω at both the input port 1016 and output port 1018.

While the presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. An RC circuit component for insertion in a transmission line, comprising:
    a monolithic substrate having a top surface;
    a capacitor supported on the substrate top surface and having first and second electrodes separated at least in part by a dielectric layer; and
    a thin-film resistor, wherein at least a portion of the thin-film resistor is stacked between the first and second electrodes in a vertical direction that is perpendicular to the top surface of the monolithic substrate, the thin-film resistor connected in parallel with the capacitor;
    wherein the portion of the thin-film resistor that is stacked between the first and second electrodes has a resistance between the first and second electrodes of about 2 ohms or greater.

2. The RC circuit component of claim 1, wherein:
    the monolithic substrate has opposing first and second longitudinal ends; and
    the component further comprises a pair of wire bond pads supported on the substrate top surface respectively at the first and second longitudinal ends thereof, and with the wire bond pads coupled respectively with the first and second electrodes of the capacitor.

3. The RC circuit component of claim 1, wherein the thin-film resistor comprises a layer of resistive material that is trimmed to provide the resistance of the thin-film resistor.

4. The RC circuit component of claim 1, wherein the thin-film resistor comprises a layer of resistive material that comprises ruthenium oxide ($RuO_2$).

5. The RC circuit component of claim 1, wherein the thin-film resistor comprises a layer of resistive material that comprises at least one of tantalum nitride (TaN) or nickel-chromium alloys (NiCr).

6. The RC circuit component of claim 1, wherein the thin-film resistor comprises a layer of resistive material that has a sheet resistance up to about 100Ω.

7. The RC circuit component of claim 1, wherein the substrate comprises at least one of fused silica or quartz.

8. The RC circuit component of claim 1, wherein the substrate comprises at least one of alumina or glass.

9. The RC circuit component of claim 1, wherein:
the monolithic substrate has a bottom surface; and
the component further comprises a ground electrode received on the substrate bottom surface.

10. The RC circuit component of claim 1, wherein the dielectric layer comprises silicon oxynitride (SiON).

11. The RC circuit component of claim 1, wherein the dielectric layer comprises barium titanate ($BaTiO_3$).

12. The RC circuit component of claim 1, wherein the monolithic substrate has a generally planar bottom surface and opposing generally planar first and second longitudinal ends.

13. The RC circuit component of claim 12, wherein the RC circuit component comprises:
a pair of wire bond pads supported on the substrate top surface respectively at the generally planar first and second longitudinal ends thereof, the pair of wire bond pads respectively coupled with the first and second electrodes of the capacitor; and
a ground electrode received on the generally planar bottom surface of the substrate.

14. An RC circuit component for insertion in a transmission line, comprising:
a monolithic substrate having a top surface;
a capacitor supported on the substrate top surface and having first and second electrodes separated at least in part by a dielectric layer; and
a thin-film resistor, wherein at least a portion of the thin-film resistor is stacked between the first and second electrodes in a vertical direction that is perpendicular to the top surface of the monolithic substrate and connected in parallel with the capacitor;
wherein the thin-film resistor has a resistive value between the first and second electrodes that is selected to provide a forward transmission coefficient, $S_{21}$, of the RC circuit component that is greater than −1.9 dB at 100 MHz.

15. The RC circuit component of claim 14, wherein the forward transmission coefficient, $S_{21}$, of the RC circuit component is greater than −1.9 dB for frequencies ranging from 100 MHz to 30,000 MHz.

16. The RC circuit component of claim 14, wherein the thin-film resistor comprises a layer of resistive material that is trimmed to provide the resistance of the thin-film resistor.

17. The RC circuit component of claim 14, wherein the thin-film resistor comprises a layer of resistive material that comprises ruthenium oxide ($RuO_2$).

18. The RC circuit component of claim 14, wherein the thin-film resistor comprises a layer of resistive material that comprises at least one of tantalum nitride (TaN) or nickel-chromium alloys (NiCr).

19. The RC circuit component of claim 14, wherein the thin-film resistor comprises a layer of resistive material that has a sheet resistance up to about 100Ω.

20. The RC circuit component of claim 14, wherein the substrate comprises at least one of fused silica or quartz.

21. The RC circuit component of claim 14, wherein the substrate comprises at least one of alumina or glass.

22. The RC circuit component of claim 14, wherein:
the monolithic substrate has a bottom surface; and
the component further comprises a ground electrode received on the substrate bottom surface.

23. The RC circuit component of claim 14, wherein the dielectric layer comprises silicon oxynitride (SiON).

24. The RC circuit component of claim 14, wherein the dielectric layer comprises barium titanate ($BaTiO_3$).

25. The RC circuit component of claim 14, wherein the RC circuit component comprises:
a pair of wire bond pads supported on the substrate top surface respectively at generally planar first and second longitudinal ends thereof, the pair of wire bond pads respectively coupled with the first and second electrodes of the capacitor; and
a ground electrode received on a generally planar bottom surface of the substrate.

26. A method for tailoring the frequency response of an RC circuit component for insertion in a transmission line, the circuit component comprising a monolithic substrate having a top surface, a capacitor supported on the top surface of the substrate and having at least partially overlapping first and second electrodes separated at least in part by a dielectric layer, the method comprising:
providing a thin-film resistor stacked at least in part between the first and second electrodes in a vertical direction that is perpendicular to the top surface of the monolithic substrate, the thin-film resistor connected in parallel with the capacitor; and
trimming a resistive layer of the thin-film resistor to provide a desired resistance of the thin-film resistor that is about 2 ohms or greater between the first and second electrodes.

* * * * *